United States Patent
Coustier et al.

(10) Patent No.: US 9,945,046 B2
(45) Date of Patent: Apr. 17, 2018

(54) DEVICE FOR MANUFACTURING A CRYSTALLINE MATERIAL FROM A CRUCIBLE HAVING NON-UNIFORM HEAT RESISTANCE

(75) Inventors: Fabrice Coustier, Chambéry (FR); Denis Camel, Chambéry (FR); Anis Jouini, Chambéry (FR); Etienne Pihan, La Motte Servolex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 609 days.

(21) Appl. No.: 14/343,004

(22) PCT Filed: Sep. 3, 2012

(86) PCT No.: PCT/FR2012/000348
§ 371 (c)(1),
(2), (4) Date: Apr. 2, 2014

(87) PCT Pub. No.: WO2013/034819
PCT Pub. Date: Mar. 14, 2013

(65) Prior Publication Data
US 2014/0224172 A1    Aug. 14, 2014

(30) Foreign Application Priority Data

Sep. 5, 2011 (FR) ..................... 1102690

(51) Int. Cl.
*C30B 11/00* (2006.01)
*C30B 11/14* (2006.01)
*C30B 29/06* (2006.01)

(52) U.S. Cl.
CPC ............ *C30B 11/003* (2013.01); *C30B 11/00* (2013.01); *C30B 11/002* (2013.01); *C30B 11/14* (2013.01);
(Continued)

(58) Field of Classification Search
CPC ..... C30B 11/00; C30B 11/002; C30B 11/003; C30B 11/14; C30B 29/00; C30B 29/02;
(Continued)

(56) References Cited

U.S. PATENT DOCUMENTS

2006/0144326 A1    7/2006 Einhaus et al.
2009/0013925 A1*   1/2009 Servant ................. C30B 11/003
                                                                    117/206
(Continued)

FOREIGN PATENT DOCUMENTS

CN    101928980 A    12/2010
CN    101935869 A     1/2011
(Continued)

OTHER PUBLICATIONS

Nov. 3, 2016 Office Action issued in Chinese Application No. 201280054252.1.

*Primary Examiner* — Kenneth A Bratland, Jr.
(74) *Attorney, Agent, or Firm* — Oliff PLC

(57) ABSTRACT

The device forming a crucible for fabrication of crystalline material by directional solidification comprises a bottom and at least one side wall. The bottom presents a first portion having a first thermal resistance and a second portion having a second thermal resistance that is lower than the first thermal resistance. The second portion is designed to receive a seed for fabrication of the crystalline material. The bottom and side wall are at least partially formed by a tightly sealed part including at least one indentation participating in defining said first and second portions. The first portion is covered by a first anti-adherent layer having an additional first thermal resistance. The second portion may be covered by a second anti-adherent layer having an additional second thermal resistance that is lower than the first thermal resistance.

21 Claims, 7 Drawing Sheets

(52) U.S. Cl.
CPC ......... *C30B 29/06* (2013.01); *Y10T 117/1092* (2015.01)

(58) Field of Classification Search
CPC ...... C30B 29/06; Y10T 117/00; Y10T 117/10; Y10T 117/1016; Y10T 117/1024; Y10T 117/1092
USPC ....... 117/11, 73, 81, 83, 200, 204, 206, 223, 117/911, 928, 931
See application file for complete search history.

(56) References Cited

U.S. PATENT DOCUMENTS

| | | | |
|---|---|---|---|
| 2011/0014582 A1* | 1/2011 | Phillips | C04B 35/584 432/247 |
| 2011/0180229 A1* | 7/2011 | Phillips | C30B 11/003 164/122.1 |
| 2011/0268958 A1 | 11/2011 | Garandet et al. | |
| 2011/0305622 A1 | 12/2011 | Dietrich et al. | |

FOREIGN PATENT DOCUMENTS

| | | |
|---|---|---|
| CN | 101979718 A | 2/2011 |
| DE | 10 2010 000 687 A1 | 7/2011 |
| DE | 10 2010 014 724 A1 | 10/2011 |
| DE | 10 2010 030 124 A1 | 12/2011 |
| FR | 2 853 913 A1 | 10/2004 |
| FR | 2 935 618 A1 | 3/2010 |
| JP | A-2000-327474 | 11/2000 |
| WO | WO 2010/005705 A1 | 1/2010 |
| WO | WO 2011/009062 A2 | 1/2011 |

* cited by examiner

DEVICE FOR MANUFACTURING A CRYSTALLINE MATERIAL FROM A CRUCIBLE HAVING NON-UNIFORM HEAT RESISTANCE

BACKGROUND OF THE INVENTION

The invention relates to a device forming a crucible for fabrication of crystalline material by directional solidification provided with a bottom and at least one side wall.

STATE OF THE ART

The silicon used in the photovoltaic industry is for the most part crystallized silicon of multicrystalline structure, i.e. single-crystal grains without a fixed orientation with respect to one another and surrounded by grain boundaries. Growth of this type of material is performed in a crucible in a crystallization furnace of Bridgman type. As illustrated in FIG. 1, crucible 10 presents a bottom 2 partially covered by a seed 3.

In order to improve the orientation of the grains in the material obtained, a seed, i.e. a growth nucleus, is deposited at the bottom of the crucible. A silicon feedstock is then deposited in the crucible and then melted taking care not to melt the seed totally. Solidification of the liquid bath is then performed from the seed which initiates crystallization in defined manner from its surface crystalline orientation.

This technique, called growth on seed, enables the growth conditions of the silicon to be better controlled, but an additional constraint exists related to the presence of the seed in the crucible. The thermal gradient inside the crucible has to be perfectly controlled in order to prevent total dissolution of the seed.

Solidification of the crystalline material from the seed can therefore only take place if the molten bath is in contact with the seed which remains at least partially in solid state. This particular disposition imposes considerable constraints on the thermal gradient inside the crucible and mainly as far as the seed is concerned.

In the document WO 2010/005705, a heat exchanger is disposed only underneath the seed inside the counter-crucible referenced 70. This particular architecture performs cooling of the liquid bath through the seed so as to reduce the risks of melting of the seed. However, this architecture also results in the creation of isotherms which are not parallel to the bottom of the crucible which is detrimental to the electric performances of the crystalline material obtained.

The document US 2011/0180229 describes a crucible having a composite bottom surface defining areas with different thermal properties for heat transfer. A similar teaching is present in the documents CN 101979718 and CN 101935869 which describe a crucible with a bottom surface provided with several indentations.

OBJECT OF THE INVENTION

One object of the invention is to provide a device forming a crucible which at least partially overcomes the drawbacks mentioned above.

This object tends to be achieved by means of a device according to the appended claims.

It is a further object of the invention to provide a method for fabrication of the crucible.

This object tends to be achieved by means of a method according to the appended claims.

It is yet a further object of the invention to provide a method for fabrication of crystalline material enabling growth from a seed present in the bottom of a crucible to be more easily controlled.

This object tends to be achieved by means of a method according to the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
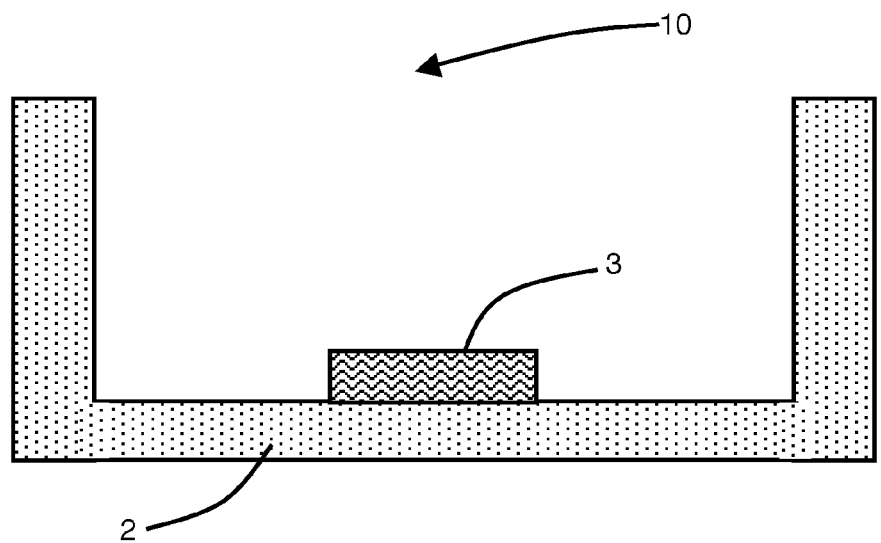
FIG. 1, already described, represents a schematic view in transverse cross-section of a crucible containing a seed, according to an example the prior art.

The device forming a crucible 10, henceforth referred to as crucible, according to the invention comprises a bottom 2 and at least one side wall 4. Crucible 10 can be of any shape. For example purposes, the cross-section, i.e. the shape formed by bottom 2 of the crucible, can be square, rectangular or cylindrical.

In the case of a crucible of square or rectangular cross-section, the crucible comprises several side walls 4 joined two by two so as to delineate, with bottom 2, the inner space of the crucible designed to receive the material when solidification takes place by directional solidification. In the case of a crucible of cylindrical cross-section, for example cylindrical in revolution, crucible 10 comprises a single side wall 4 which extends along the periphery of the bottom so as to delineate, with bottom 2, the inner space of the crucible. Side walls 4 are perpendicular to bottom 2 of crucible 10 or substantially perpendicular to bottom 2.

Bottom 2 and side wall or walls 4 of crucible 10 form part of a tightly sealed part 1 of crucible 10.

Tightly sealed part 1 is made from a material that is able to withstand the high temperatures undergone during the melting and solidification phases. In preferential manner, tightly sealed part 1 of crucible 10 is made from silica. Tightly sealed part 1 can also be made from graphite or from composite material comprising a mixture of resin and of reinforcing fibres, such as carbon fibres.

Crucible 10 is preferably made in a single part in order to enhance the mechanical strength, but it can also in addition comprise the tightly sealed part of other add-on elements.

Crucible 10, by means of its tightly sealed part 1, performs a tightness function with respect to the molten material, i.e. bottom 2 and side walls 4 do not enable the molten material to escape from the crucible.

Bottom 2 of crucible 10 presents a first portion 2a with a first thermal resistance value and a second portion 2b with a second thermal resistance value that is lower than the first value. What is meant by thermal resistance is the capacity of the bottom of the crucible to limit the heat transfer between the inner and outer surfaces. Second portion 2b is designed to receive a seed made from a second crystalline material to assist fabrication of the crystalline material. The second crystalline material can be identical to or different from the material to be solidified.

This particularity of crucible 10 enables the heat to be more easily extracted through second portion 2b than through first portion 2a. The second portion can be of any shape, or example square, round, or rectangular. The value of the thermal resistance is measured between the inner surface of the crucible and the outer surface of the crucible in a direction more or less perpendicular to the inner and outer surfaces.

Furthermore, according to the invention, tightly sealed part 1 comprises at least one indentation which participates in defining first and second portions 2a and 2b. The indentation or indentations are arranged on the bottom of tightly sealed part 1 and the indentations can be located at the level of the inner surface or at the level of the outer surface of the tightly sealed part. The inner surface of tightly sealed part 1 is that which is designed to receive the material to be solidified.

Bottom 2 and side wall 4 of the device forming the crucible are at least partly formed by tightly sealed part 1, which is preferably monoblock, and even more preferably monolithic, i.e. made from a single material. In the case of a monolithic integration, tightly sealed part 1 forms crucible 10. In the case of a monoblock integration, tightly sealed part 1 is associated with one or more additional elements to form crucible 10.

According to a first preferred embodiment, the indentation in bottom 2 of the tightly sealed part of crucible 1 defines or contains second portion 2b of the bottom of the crucible.

Figure 2:
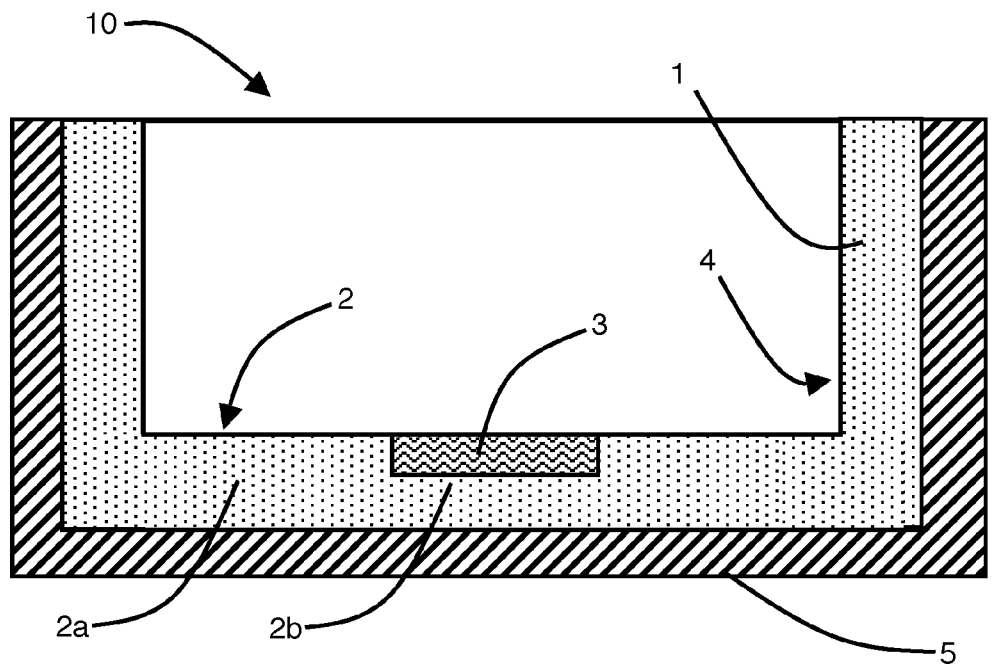
FIGS. 2 to 5 represents, in schematic manner in transverse cross-section, different variants of a crucible according to a first embodiment of the invention containing a seed.

As shown in FIG. 2, tightly sealed part 1 comprises an indentation located in the inner surface of bottom 2. The indentation defines second portion 2b.

First portion 2a can completely surround second portion 2b which here is located substantially in the centre of bottom 2 of tightly sealed part 1, with respect to side walls 4. First portion 2a extends over the whole contour of second portion 2b.

Bottom 2 of tightly sealed part 1 can comprise a first portion 2a forming a ring, preferably presenting an axis of symmetry perpendicular to the bottom of the crucible, around second portion 2b in order to preserve a maximum symmetry in the heat exchanges within the crucible.

Figure 6:
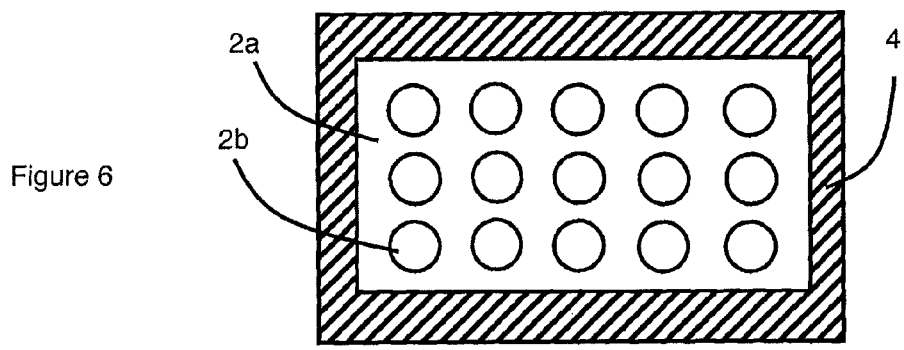
FIGS. 6 and 7 represent, in schematic manner, in top view and in perspective view, a crucible provided with circular cavities formed in the inner surface of the bottom of the crucible.
Figure 7:
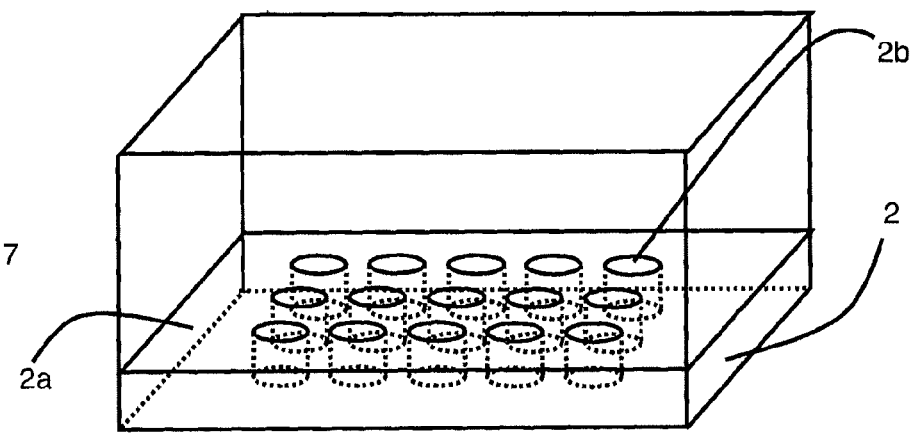

In an alternative embodiment, bottom 2 of tightly sealed part 1 comprises a plurality of first portions 2a and second portions 2b. For example purposes, bottom 2 comprises a plurality of second portions 2b which are all surrounded by a first portion 2a (FIGS. 6 and 7).

In a preferred embodiment, first and second portions 2a, 2b connected to side surfaces of bottom 2 of the crucible. The two surfaces can be two consecutive side walls or two opposite side walls. In this case, first portion 2a at least partially surrounds second portion 2b, i.e. first portion 2a extends over at least a part of the contour of second portion 2b (FIGS. 8 to 11).

The first and second portions advantageously present parallel longitudinal axes. In an even more privileged embodiment, there is an alternation between the first and second portions in the bottom of tightly sealed part 1.

When several second portions 2b are used, it is possible to mix the different embodiments illustrated in the foregoing in the bottom of tightly sealed part 1.

As shown in FIG. 2, the thickness of first portion 2a is greater than the thickness of second portion 2b so as to obtain a difference of thermal resistance in bottom 2 of tightly sealed part 1.

In the embodiments illustrated in FIG. 2, the outer wall of bottom 2 of tightly sealed part 1 is flat which enables the load imposed by the molten bath to be distributed and prevents rapid deformation of tightly sealed part 1 during use of the latter. The indentation, or recessed area, present at the level of the inner surface of bottom 2 of the tightly sealed part, defines second portion 2b. The indentation is an area of reduced thickness in the tightly sealed part, such as a recess or a blind hole. The indentation comprises a bottom and at least one side wall.

This indentation is a preferential area for placing seed 3 as it enables a better removal of the heat originating from the molten material bath. In preferential manner, seed 3 has smaller lateral dimensions than that of the indentation so as to prevent any overlapping giving rise to a set of stresses able to cause breaking of the seed.

Figure 3:
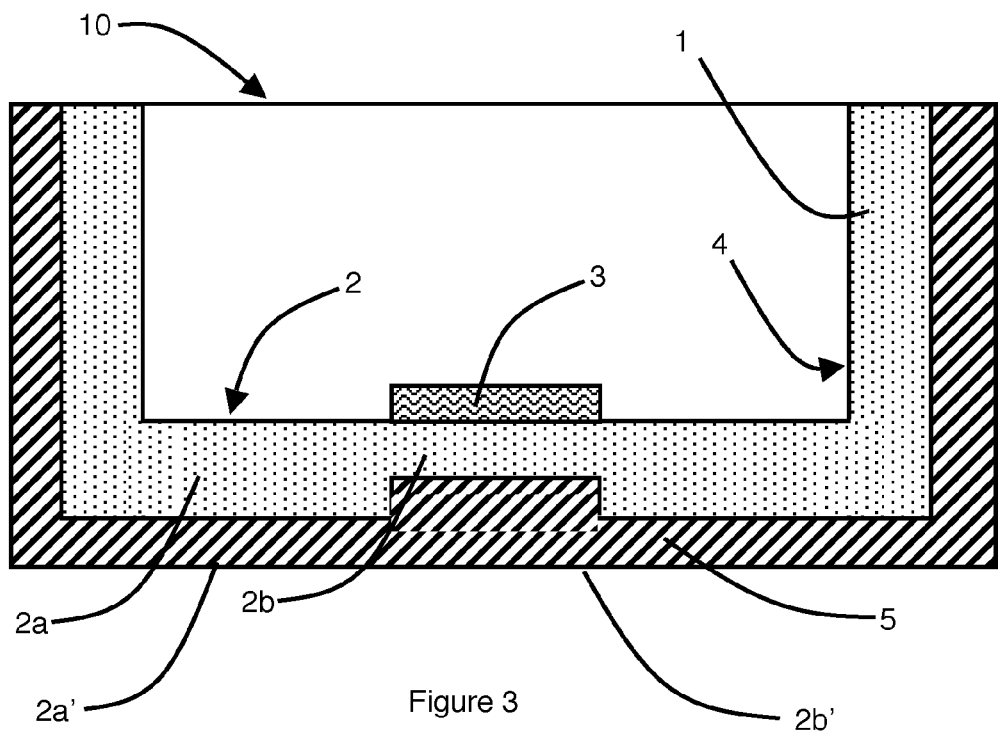

In a variant of the first embodiment illustrated in FIG. 3, the inner wall of bottom 2 of tightly sealed part 1 is flat which facilitates implementation of tightly sealed part 1. The indentation, or recessed area, present at the level of the outer surface of the bottom of tightly sealed part 1 defines second portion 2b. Seed 3 is placed at least partially above second portion 2b in order to take advantage of the better heat removal from the molten material bath. Seed 3 is salient in the bottom of tightly sealed part 1 and it can in preferential manner extend beyond second portion 2b. Thinning of the bottom of tightly sealed part 1 is performed from the outer surface which is easy to achieve and avoids damaging the inner surface which has to receive the material to be crystallized.

Figure 4:
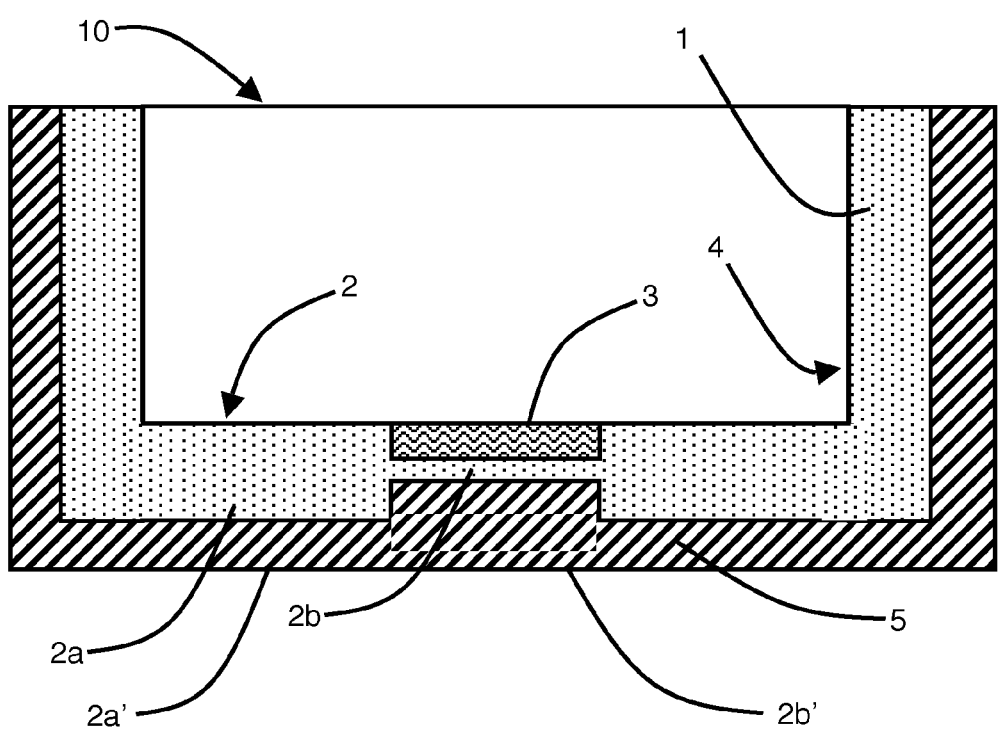

In another variant of the first embodiment illustrated in FIG. 4, second portion 2b reflected in the presence of indentations, or recessed areas, on the inner and outer surfaces of bottom 2 of tightly sealed part 1. These two recessed areas are facing one another. In preferential manner, the two indentations have the same pattern. However, it is not excluded to have one pattern larger than the other or an offset preventing a complete overlap so as to form different areas with intermediate resistance values.

It is interesting to place one or more seeds 3 inside the indentation of the inner surface of bottom 2 in order to take advantage of a reduced thermal resistance and to better control the crystalline orientation in the solidified material.

In the different embodiments illustrated in the foregoing, tightly sealed part 1 forms crucible 10. In preferential manner, tightly sealed part 1 is monolithic, i.e. it is made from a single material to reduce the thermal expansion stresses.

Figure 5:
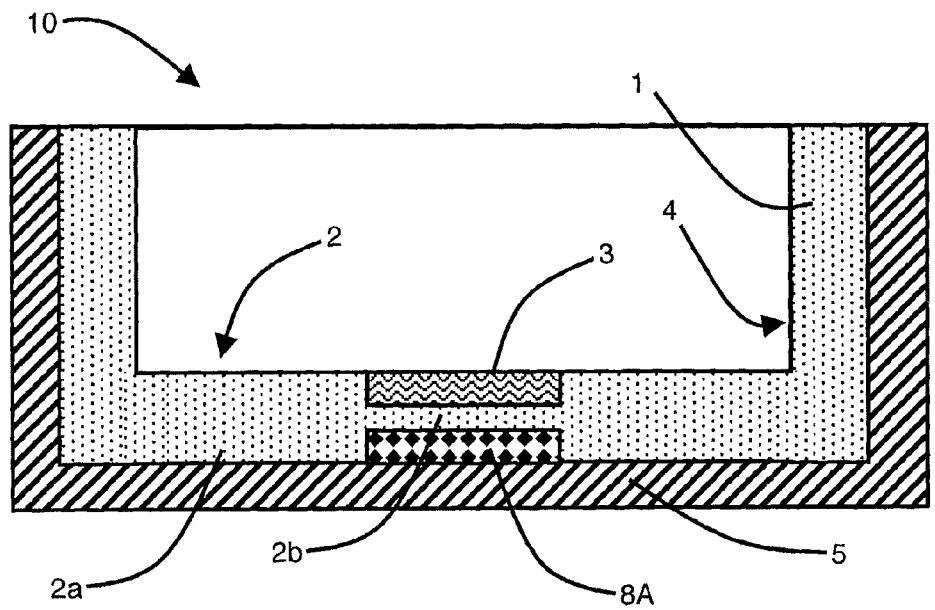

In yet another variant of the first embodiment illustrated in FIG. 5, the device forming crucible 10 can comprise tightly sealed part 1 associated with an additional part 8A. The bottom of crucible 10 thus comprises the bottom of tightly sealed part 1 as well as part 8A. The outer surface of the bottom of tightly sealed part 1 comprises an indentation and additional part 8A is configured to be housed in this indentation. The dimensions of part 8A are smaller than those of the indentation so as to penetrate into the indentation. Crucible 10 comprises a first portion 2a having a first thermal resistance value and a second portion 2b having a second thermal resistance value that is lower than the first value. The indentation participates in defining the two portions in the bottom of crucible 10, here second portion 2b corresponds to the indented area.

Additional part 8A is configured in such a way that the sum of its thermal resistance with that of tightly sealed part 1 in second portion 2b is always lower than the thermal resistance value of tightly sealed part 1 in first portion 2a. The second thermal resistance originates from tightly sealed part 1 being placed in series with part 8A at the level of second portion 2b. The first thermal resistance is formed by tightly sealed part 1 at the level of first portion 2a. Additional part 8A is made from a material presenting a low thermal resistivity, lower than that of the bottom of tightly sealed part 1, for example made from graphite or from molybdenum in the case of a tightly sealed part made from silica.

In the case where part 8A presents a smaller surface than that of the indentation, it is possible to define two portions having two different thermal resistance values inside the surface delineated by the indentation. The second portion is defined by the contact area with part 8A and the first portion occupies the complementary surface.

In a particular embodiment that is able to be combined with the previous embodiments, it is interesting to couple crucible 10 with a reinforcing element 5 which performs the role of counter-crucible for the purposes of reducing deformation of the crucible 1 at high temperature. In general manner, when the bottom of crucible 10 and the bottom of counter-crucible 5 are made from different materials, the material forming the bottom of counter-crucible 5 presents a lower thermal resistivity than that of the material forming bottom 2 of crucible 10 so as to ensure a good heat transfer from the crucible to the environment. In a preferential embodiment, counter-crucible 5 is made from graphite or from carbon fiber composite (CFC) material.

In a particular embodiment, the bottom of counter-crucible 5 and the bottom of crucible 10 present complementary shapes which enables the stresses applied by the weight of the molten bath on crucible 1 and on counter-crucible to be well distributed. This also enables the volume of gas imprisoned between crucible 1 and counter-crucible 5 to be limited.

Tightly sealed part 1 receives the material to be solidified and the materials used are chosen so as to limit contamination. Counter-crucible 5 can be made from different materials and/or with a poorer surface quality as the molten material is not in direct contact with counter-crucible 5.

In the embodiment illustrated in FIG. 2, the thermal resistance of the bottom of counter-crucible 5 is constant, as the thickness of the material forming the bottom of counter-crucible 5 is constant. There are then two different thermal resistance values in the bottom of the assembly formed by tightly sealed part 1 and counter-crucible 5. The total thermal resistance difference is linked to the thermal resistance difference existing in tightly sealed part 1, and therefore in crucible 10, as was described in the foregoing.

In the embodiments illustrated in FIGS. 3 and 4, the thermal resistance of the bottom of counter-crucible 5 is not constant. Two different thermal resistance values exist, as the thickness of the material forming the bottom of counter-crucible 5 is variable. The bottom of counter-crucible 5 presents a flat outer surface and the variation of thickness enables the indentation present in the outer surface of tightly sealed part 1 to be filled. The extra thickness of counter-crucible 5 enables complementary shapes to be had for tightly sealed part 1 and counter-crucible 5. The extra thickness defines a second area 2b' adjacent to first area 2a'.

The thermal resistance of second portion 2b' of counter-crucible 5 is higher than the thermal resistance of first portion 2a' of the latter.

Two different thermal resistance values then exist in the bottom of the assembly formed by tightly sealed part 1 and counter-crucible 5. The total thermal resistance difference in the bottom of said assembly is linked to the thermal resistance difference existing in tightly sealed part 1 and to that existing in counter-crucible 5. The two first areas 2a and 2a' are placed in thermal series between the inner surface of tightly sealed part 1 and the outer surface of counter-crucible 5. The same is true of the two second areas 2b and 2b'.

In these embodiments, the materials forming the bottom of tightly sealed part 1 and the bottom of counter-crucible 5 and if applicable the depth of the indentation are chosen in such a way that the cumulated thermal resistance of second areas 2b and 2b' is lower than the cumulated thermal resistance of first areas 2a and 2a'. More precisely, the material of the bottom of the counter-crucible presents a lower resistivity than that of the material of the bottom of tightly sealed part 1. The crucible comprises a bottom with a first area 2a having a first thermal resistance value and a second area 2b having a second thermal resistance value that is lower than the first value. These two areas are defined by means of the indentation formed in the tightly sealed part. Seed 3 is placed facing the second area in order to take advantage of an enhanced heat removal through the crucible and the counter-crucible.

In yet another variant of the first embodiment illustrated in FIG. 5, when tightly sealed part 1 and counter-crucible 5 are not of complementary shapes, it is preferable to add additional part 8A to the assembly. Part 8A is configured so as to fill the void area located between counter-crucible 5 and tightly sealed part 1 and to enhance heat extraction via the second portion of crucible 10. The material of part 8A thus presents a lower thermal resistivity than that of the bottom of the tightly sealed part, and advantageously lower than or equal to that of the bottom of counter-crucible 5.

This additional part 8A is disposed between tightly sealed part 1 and counter-crucible 5 in order to fill the indentation which exists on the outer surface of bottom 2 of tightly sealed part 1 and possibly the inner surface of the bottom of counter-crucible 5.

As for the previous embodiments, two different thermal resistance values then exist in the bottom of the assembly formed by counter-crucible 5 and crucible 10. The total thermal resistance difference in the bottom of said assembly is essentially linked to the thermal resistance difference existing in crucible 10 formed by tightly sealed part 1 provided with additional part 8A.

The inner surface of counter-crucible 5 can comprise an indentation to facilitate positioning of additional part 8A. Additional part 8A can also be configured in such a way that the sum of its thermal resistance with the thermal resistance of the second portions of tightly sealed part 1 and of counter-crucible 5 is lower than the sum of the thermal resistances of the first portions of tightly sealed part 1 and of counter-crucible 5 when part 8A sinks into tightly sealed part 1 and into counter-crucible 5 (not shown).

This embodiment for example makes it possible to use a tightly sealed part 1 provided with an indentation on its outer surface and a counter-crucible 5 having a flat inner surface for the bottom.

If additional part 8A sinks into tightly sealed part 1 and counter-crucible 5, care should be taken to choose the material of part 8A so as to have a lower thermal resistance for the stack formed by tightly sealed part/part 8N counter-crucible at the level of second portion 2b than that of the couple formed by tightly sealed part/counter-crucible at the level of first portion 2a.

FIG. 6 represents a top view of a tightly sealed part 1 provided with a plurality of second portions 2b formed by circular indentations on the inner surface. FIG. 7 represents a perspective view of the bottom of a tightly sealed part 1 provided with a plurality of circular cavities. The circular cavities are designed to receive a seed. Side walls 4 are represented in schematic manner without any thickness for ease of understanding.

Figure 8:
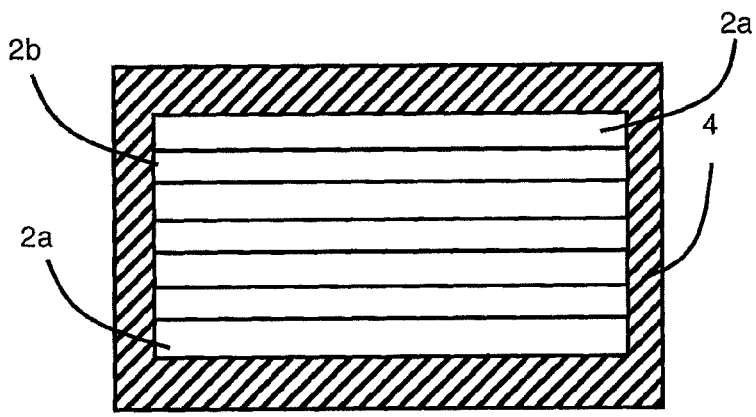
FIGS. 8 to 11 represent, in schematic manner, in top view and in perspective, a crucible provided with longitudinal cavities formed in the inner surface of the bottom of the crucible, the cross-section of the cavities being rectangular or triangular.

FIG. 8 represents a top view of a crucible 10 provided with a plurality of rectangular second portions 2b. First and second portions 2a and 2b extend from one side wall to the opposite side wall and in this example define an alternation between the first and second portions. In the illustrated example, first portions 2a are also rectangular in top view.

Figure 9:
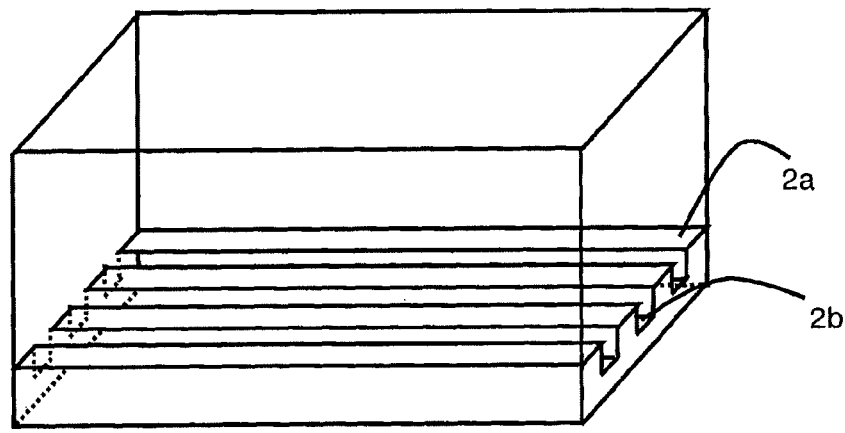
Figure 10:
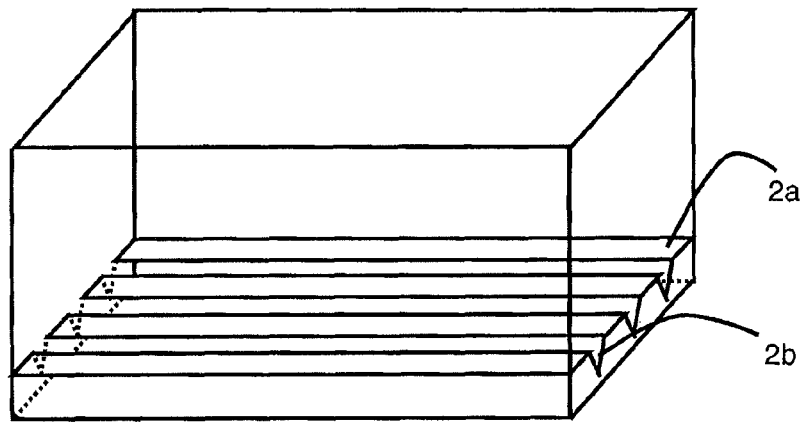

FIGS. 9 and 10 represent a perspective view of the bottom of a crucible provided with a plurality of rectangular cavities configured to receive a seed having the shape of a bar. The side walls are represented in schematic manner without any thickness. In the case of FIG. 9, the cavities have a rectangular or square cross-section in order to receive seeds having a cross-section of complementary shape. In the case of FIG. 10, the cavities have a triangular cross-section in order to preferentially receive seeds also having a triangular cross-section.

Figure 11:
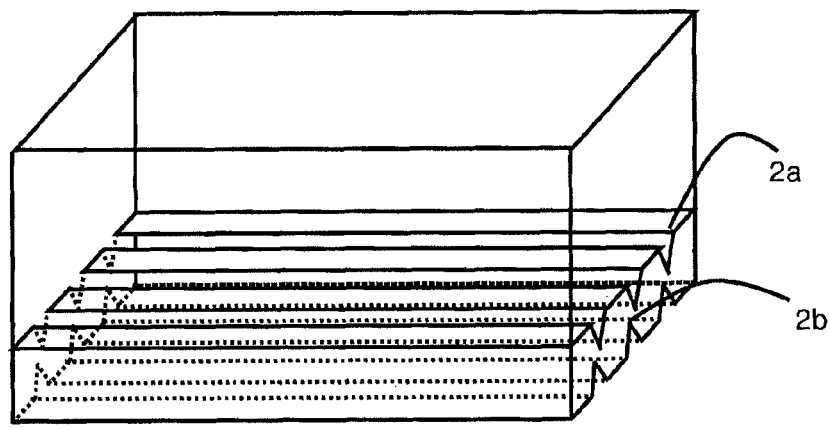

FIG. 11 represents a crucible provided with the same inner cavities as the crucible of FIG. 10. The crucible further comprises cavities formed on the outer surface of bottom 2 of crucible 1. The cavities of the outer surface are arranged facing the cavities of the inner surface, i.e. immediately underneath, so as to facilitate heat extraction in second portions 2b.

Figure 12:
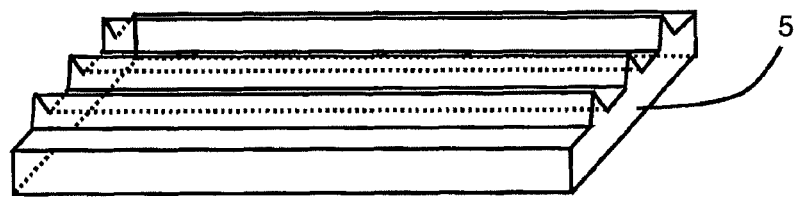
FIG. 12 represent, in schematic manner in perspective view, a counter-crucible provided with longitudinal protuberances designed to collaborate with the longitudinal cavities formed in the outer surface of the bottom of the crucible of FIG. 11.

As indicated in the foregoing, counter-crucible 5 can also present salient areas designed to embed in the recessed areas present on the outer surface of bottom 2 of crucible 1. FIG. 12 illustrates a perspective view of a counter-crucible 5 able to be embedded with the crucible represented in FIG. 11.

Figure 13:
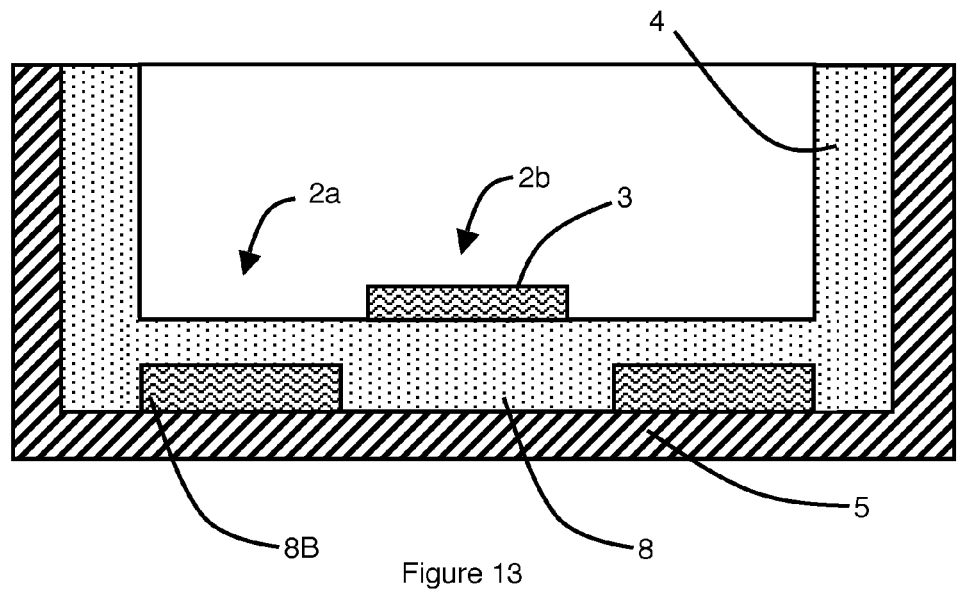
FIG. 13 represents in schematic manner, in transverse cross-section, a crucible according to a second embodiment of the invention.

In a second embodiment illustrated in FIG. 13, the device forming crucible 10 comprises tightly sealed part 1 associated with an additional part 8B. The outer surface of the bottom of tightly sealed part 1 comprises an indentation, and additional part 8B is configured so as to be housed in this indentation. The dimensions of part 8B are smaller than those of the indentation so as to penetrate into the indentation. The bottom of crucible 10 comprises a first portion 2a having a first thermal resistance value and a second portion 2b having a second thermal resistance value that is lower than the first value. The indentation participates in defining the two portions 2a and 2b in the bottom of tightly sealed part 1.

Additional part 8B is configured in such a way that the sum of its thermal resistance with the thermal resistance of tightly sealed part 1 at the level of second portion 2b is greater than the thermal resistance value of tightly sealed part 1 at the level of first portion 2a. In this way, the bottom of crucible 10 presents a first portion 2a with a first thermal resistance value and a second portion 2b with a lower second thermal resistance value than the first value. The first thermal resistance of crucible 10 results from tightly sealed part 1 being placed in series with part 8B at the level of second portion 2b. At the level of first portion 2a, the second thermal resistance of crucible 10 is formed by tightly sealed part 1 only.

In the second embodiment, part 8B is formed from a material that is more thermally insulating than the bottom of tightly sealed part 1, i.e. the material of part 8B presents a higher thermal resistivity than that of the material of the bottom of tightly sealed part 1. In the second embodiment, the indentation of tightly sealed part 1 no longer serves the purpose of defining second portion 2b of crucible 10 but first portion 2a of crucible 10.

This second embodiment enables an area with a high thermal resistance to be formed at the level of portion 2a comprising the indentation. The seed is placed facing the area of lower thermal resistance, here outside portion 2a facing the indentation, at the level of second portion 2b.

For illustrative purposes, in the case where the crucible is made from graphite, SiC, or from a carbon fibre/SiC composite, additional parts 8B providing a thermal insulation in the indentations are then preferably made from low-density graphite fibres, for example lower than 0.25 $g/cm^3$, in preferential manner between 0.14 and 0.20/$cm^3$, so as to have a notable thermal resistance difference in the thickness range of the indentations to be filled. Other materials are however possible, for example boron nitride, alumina, silicon nitride, yttria-stabilized zirconia, zirconia, quartz and silica.

In an embodiment that is not represented, counter-crucible 5 can also present indentations that are not complementary to the outer surface of the crucible. These indentations can then be filled by a material which is more thermally insulating than the material forming the bottom of the crucible and/or the bottom of the counter-crucible in order to form an area of higher thermal resistance.

The different embodiments dealt with above can be combined with one another in one and the same crucible as can the different variants described.

In a particular embodiment illustrated in FIG. 2 which can be combined with the previous embodiments, bottom 2 of tightly sealed part 1 is partially or completely covered by an anti-adherent layer 9. In a first instance, second portion 2b of the bottom of tightly sealed part 1 is devoid of anti-adherent layer 9 and first portion 2a is covered by anti-adherent layer 9. The particular location of anti-adherent layer 9 enables a better heat extraction to be preserved at the level of second portion 2b compared with first portion 2a. In a second instance, illustrated in FIG. 3, two different anti-adherent layers 9a and 9b are deposited in the bottom of tightly sealed part 1. First anti-adherent layer 9a is deposited in the first portion 2a whereas second anti-adherent layer 9b is deposited in second portion 2b. The thermal characteristics of the first and second anti-adherent layers are chosen such as to increase the thermal resistance difference between the two portions 2a and 2b. Second anti-adherent layer 9b therefore has a lower thermal resistance than that of first anti-adherent layer 9a. The difference of thermal conductivity between first anti-adherent layer 9a and second anti-adherent layer 9b or between the areas comprising anti-adherent layer 9 and the areas devoid of anti-adherent layer 9 is advantageously comprised between 0.5 and 5 W/mK for a thickness of 500 µm. This thermal conductivity difference has a particularly important effect for a graphite crucible which is very thermally conductive.

In other words, first portion 2a is covered by a first anti-adherent layer 9 having an additional first thermal resistance and second portion 2b may be covered by a second anti-adherent layer 9b having an additional second thermal resistance that is lower than the first thermal resistance.

First anti-adherent layer 9a can be thicker than second anti-adherent layer 9b. In a particular embodiment, first anti-adherent layer 9a is made from the same material as second anti-adherent layer 9b.

Figure 15:
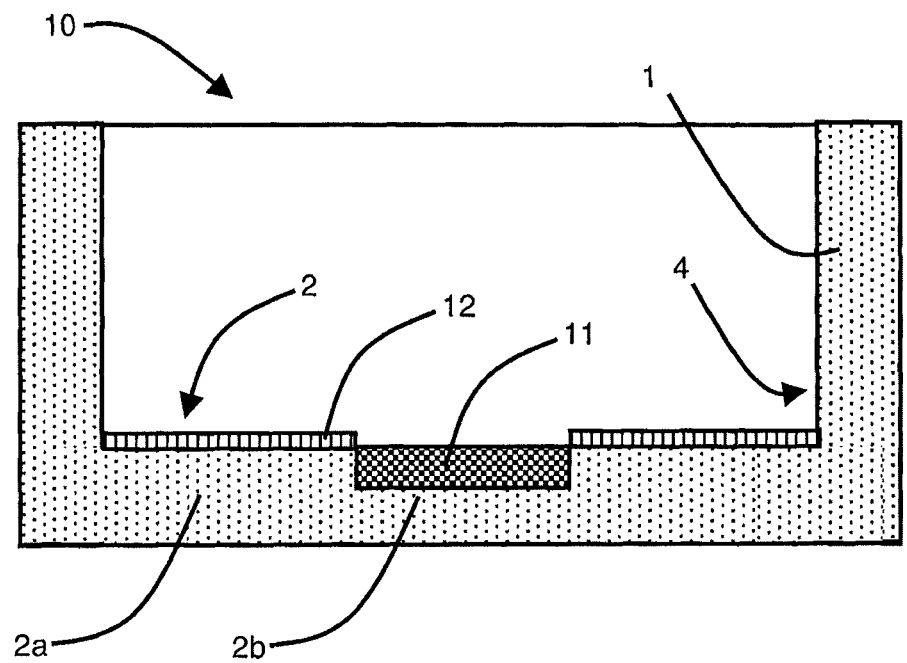
FIGS. 15 and 16 represent two steps of the method for forming the anti-adherent layer in the bottom of the crucible.
Figure 16:
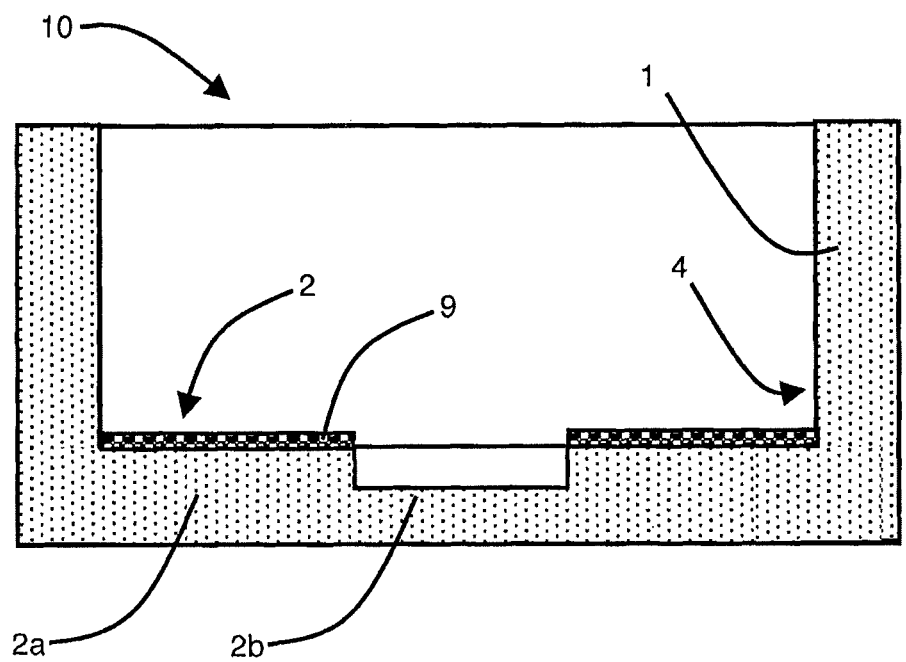

As illustrated in FIG. 15, in order to form a second portion 2b devoid of anti-adherent layer 9, it is possible to use a mask 11 applied on second portion 2b. In a particular embodiment, mask 11 is formed before deposition of the coating designed to form anti-adherent layer 9. The mask is removed after deposition of the material designed to form anti-adherent layer 9, for example after the spraying step. Mask 11 is removed before the annealing step of formation of anti-adherent layer 9. In a particular embodiment, mask 11 is a sheet of paper.

The first deposition phase can be followed by a second deposition phase of a material designed to form an anti-adherent layer. The first deposition phase defines a first pattern and the second deposition phase can be a deposition on the whole of the bottom, i.e. on the first and second portions in order to form first anti-adherent layer 9a and second anti-adherent layer 9b having a smaller thickness. If the same material is deposited in both the phases, the same anti-adhesive material is present above first and second portions 2a and 2b with different thicknesses. If the two materials are different, the thickness and composition between first anti-adherent layer 9a and second anti-adherent layer 9b are different.

In other words, selective formation of anti-adherent layer 9 or of first anti-adherent layer 9a can be performed in the following manner:
    forming a mask 11 on bottom 2 of crucible 10 so as to define areas covered by mask 11 and uncovered areas,
    depositing a coating 12 designed to form an anti-adherent layer 9,
    eliminating mask 11,
    annealing coating 12 to form first anti-adherent layer 9a or anti-adherent layer 9.

This fabrication method is particularly easy to implement to define various patterns on the bottoms of flat or textured crucibles.

Eliminating anti-adherent layer 9 underneath the future position of seed 3 enables contamination of seed 3 to be reduced in the case where crucible 10 is purer than anti-adherent layer 9.

Anti-adherent layer 9 is advantageously a porous layer which is not or which is hardly infiltrated by silicon (in particular in molten state) so that the solidified silicon present a weak adhesion with anti-adherent layer 9.

For example purposes, the anti-adherence quality of an anti-adherent layer 9 is analysed by deposition of a drop of silicon on anti-adherent layer 9 and with studying of the variation of its volume in time. The greater the variation of the volume of the drop of silicon, the more the silicon has penetrated into anti-adherent layer 9. This has the result that the larger the variation of volume, the less good the anti-adherence qualities of studied layer 9. In conventional manner, the studied anti-adherent layer 9 is deposited on a layer of the material forming crucible 10 in order to come as close as possible to the actual conditions of use.

In a particular embodiment, anti-adherent layer 9 is made from silicon nitride which is advantageously oxidized on the contact surface with the future silicon feedstock.

For example purposes, an anti-adherent layer 9 having a thickness comprised between 50 µm and 1000 µm gave good experimental results.

In particularly advantageous manner, anti-adherent layer 9 is deposited by spray coating. Spray deposition is preferably followed by an annealing step configured to eliminate the solvent accompanying the material forming the anti-adherent layer, for example water. This annealing can be achieved by a plateau at a first temperature that is higher than the vaporization temperature of the solvent.

Spray deposition is followed by a second annealing configured to make the material of anti-adherent layer 9 react so as to form the porous layer. This second annealing is advantageously performed at a temperature of more than 875° C. In advantageous manner, the annealing is performed under an oxidizing gas which enables the material forming anti-adherent layer 9 to be oxidized, for example enabling a silicon nitride powder to be oxidized.

The crucible/counter-crucible assembly presents a variable thermal resistance depending on whether it is facing first portion 2a of the bottom of crucible 10 or second portion 2b of the bottom of crucible 10. Even if counter-crucible 5 comprises a thickening facing second portion 2b of the bottom of the crucible, the global thermal resistance of the crucible and of the counter-crucible at the level of first portion 2a is greater than that of the crucible and of the counter-crucible at the level of second portion 2b.

It is particularly advantageous to place the thermal resistance difference at bottom 2 of crucible 10 in comparison with the bottom of counter-crucible 5, as the thermal resistance difference between the different portions of the bottom of the crucible may be more marked and therefore more efficient.

In the same way as for crucible 10, counter-crucible 5 can present first and second portions with different thermal resistances. In preferential manner, the first and second portions of crucible 10 and of counter-crucible 5 are respectively facing one another.

In a preferential embodiment which can be combined with the previous embodiments, the outer wall of the bottom of counter-crucible 5 is flat which improves the bearing of counter-crucible 5 on its support and heat transmission by conduction.

Figure 14:
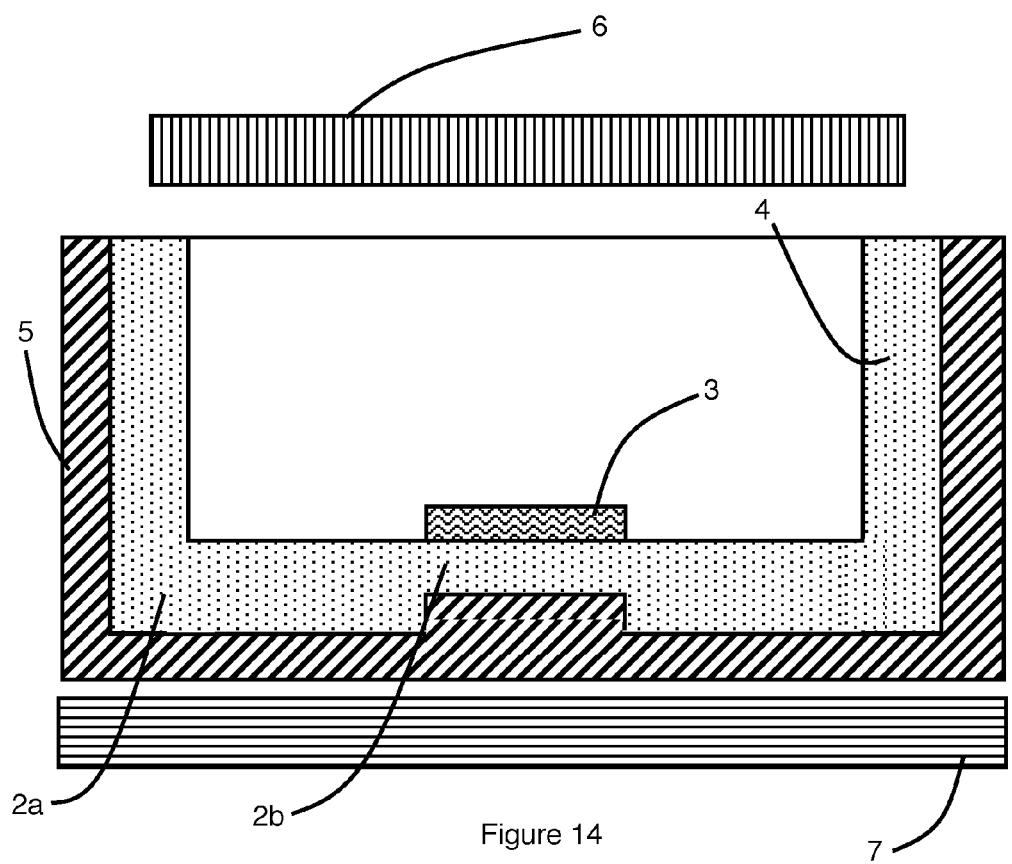
FIG. 14 represents in schematic manner, in transverse cross-section, a solidification device according to the invention provided with a crucible and a seed.

The crucible 10 is advantageously designed to be used in a directional solidification device to obtain ingots of crystallized material. The device comprises means for generating a thermal gradient inside crucible 10. The means for generating the thermal gradient comprise a heat source 6 which can be located for example above crucible 10 or on the sides of crucible 10. The means for generating the thermal gradient also comprise a heat extractor 7 which is arranged underneath crucible 10. Such a device is illustrated in FIG. 14 for example purposes.

By adjusting the quantity of heat emitted by heat source 6 and absorbed by heat extractor 7, it is possible to adjust the temperature in crucible 10 and the form of the thermal gradient inside crucible 10.

In a preferred embodiment, heat extractor 7 is located facing first portion 2a and second portion 2b of the bottom of crucible 10. Heat extractor 7 then absorbs heat via first portion 2a of the crucible, but also via second portion 2b of the crucible. This enables isotherms that are flatter and more parallel to the bottom of crucible 10 to be maintained. The grains obtained are more perpendicular to the bottom of the crucible than in the prior art. In preferential manner, heat extractor 7 is located facing the whole of the surface of the bottom of crucible 10 in order to have isotherms that are very flat and parallel to the bottom of the crucible over the whole of the crucible.

The thermal resistance of second portion 2b being lower than the thermal resistance of first portion 2a, better cooling of bottom 2 of crucible 10 is achieved in second portion 2b. The material to be solidified in contact with first portion 2a can be in liquid state whereas the same material has remained in solid state when it is in contact with second portion 2b. The temperature of the bottom of the crucible can be adjusted in simple and economic manner, for example with a single heat extractor covering the whole of the bottom of the crucible which facilitates control of the thermal gradient during melting and/or solidification.

This architecture also enables a greater flexibility in the scope of the methods able to be used. It is thus possible to use, in the same solidification device, conventional crucibles and counter-crucibles and crucibles 10 and counter-crucibles 5 with variable thermal resistances in order to facilitate growth from seeds 3. It is also possible to associate a modified crucible 10 with a conventional counter-crucible 5 according to the embodiments envisaged in the foregoing. In preferential manner, seed 3 partially covers the bottom of the tightly sealed part and in even more preferential manner the areas with the lowest thermal resistances. This particularity enables the seed to be more easily kept in solid state throughout the melting/solidification method.

The material to be solidified deposited in crucible 10 is for example silicon, germanium, gallium arsenide, etc. Seed 3 used in bottom 2 of crucible 10 can be a monocrystalline or multicrystalline seed.

In a first exemplary embodiment, the crucible has a square base for example of 840×840 mm² type. Bottom 2 of the crucible is machined so as to form at least one area with a circular depression having a diameter equal to 125 mm. The depression depth is equal to 8 mm. The thickness of the walls of the crucible is 20 mm.

The inner walls of the crucible are covered by an anti-adherent layer made from silicon nitride in order to prevent any direct contact between the silicon to be crystallized and crucible 10 made from silica. Second portions 2b do not comprise an anti-adherent layer.

A monocrystalline silicon seed 3 with a <100> orientation is disposed in each second portion 2b.

A solar-grade silicon feedstock substantially equal to 400 kg is deposited in crucible 10. The feedstock is molten and in contact with monocrystalline seed 3. Solidification is initiated from monocrystalline seed 3 in order to impose the required crystalline orientation. One or more thermocouples are placed underneath crucible 10 in order to determine the position of the melting temperature of the silicon in the crucible with respect to the bottom of crucible 10.

Conventionally, the thermal gradient inside crucible 10 is vertical, the temperature decreasing from the top to bottom 2 of crucible 10. Solidification of the material inside crucible 10 thus results in formation of grain boundaries perpendicular to the bottom of crucible 10. This configuration is advantageous for use in photovoltaic devices.

Heat regulation inside crucible 10 is performed by any known means so as to keep the thermal gradient in crucible 10 stable and vertical.

In preferential manner, the seed or seeds have a thickness comprised between 5 and 25 mm so as to have a certain operating margin in partial melting of the seed at the beginning of the solidification phase. In even more preferential manner, the seed has a thickness comprised between 8 and 12 mm in order to be able to integrate it in an indentation of the crucible without having too great an impact on the isotherms in crucible 10.

The thickness of crucible 10 is preferably comprised between 12 and 40 mm. In a particular embodiment, the thickness of the crucible is comprised between 20 and 30 mm. The thinner the crucible, the better the heat extraction, but the more fragile the crucible. However, in this temperature range, it is possible to form a crucible with a good thermal resistance difference between the different portions without greatly reducing the solidity of the crucible. In an even more particular embodiment, the thickness of the crucible is comprised between 20 and 22 mm. This range gave the best trade-off between heat extraction, solidity of the crucible and thermal resistance difference.

The thickness of counter-crucible 5 is preferably comprised between 5 and 200 mm so as to have both a good mechanical strength and a moderate thermal resistance. In a preferred embodiment, the thickness of counter-crucible 5 is comprised between 10 and 60 mm when the latter is made from graphite. Increasing the thickness of the counter-crucible enables its mechanical strength to be increased. In another embodiment, the thickness of counter-crucible 5 is comprised between 10 and 30 mm when the latter is made from a carbon fibre composite CFC.

The invention claimed is:

1. A device forming crucible for fabrication of crystalline material by directional solidification comprising a bottom and at least one side wall wherein the bottom comprises:
   a first portion presenting a first thermal resistance and a second portion presenting a second thermal resistance that is lower than the first thermal resistance,
   the bottom and said at least one side wall being at least partly formed by a tightly sealed part comprising at least one indentation participating in defining said first and second portions,
   wherein the first portion is covered by a first anti-adherent layer having a first face in contact with the bottom of the crucible and a second face designed to be in contact with the crystalline material, the first anti-adherent layer having an additional first thermal resistance measured between said first and second faces, and
   wherein the second portion is covered by a second anti-adherent layer having a first face in contact with the bottom of the crucible and a second face designed to be in contact with the crystalline material, the second anti-adherent layer having an additional second thermal resistance that is lower than the first thermal resistance and measured between said first and second faces.

2. The device according to claim 1, wherein the first anti-adherent layer has a thickness greater than a thickness of the second anti-adherent layer, the thicknesses being measured on the bottom of the crucible.

3. The device according to claim 1, wherein the first anti-adherent layer and the second anti-adherent layer are made from the same material.

4. The device according to claim 1, comprising a plurality of first and second portions with an alternation arrangement between the first and second portions from a first side wall to an opposite second side wall.

5. The device according to claim 1, wherein an inner wall of the bottom of the tightly sealed part comprises an indentation representative of the second portion.

6. The device according to claim 1, wherein an inner wall of the bottom of the tightly sealed part is flat.

7. A method for fabrication of a crucible according to claim 1 for directional solidification comprising a bottom and at least one side wall comprising:
forming a mask on the bottom of the crucible so as to define areas covered by the mask and uncovered areas,
depositing a first coating designed to form a first anti-adherent layer,
eliminating the mask,
depositing a second coating designed to form a second anti-adherent layer, and
annealing the first and second coatings to form the first and second anti-adherent layers.

8. The method according to claim 7, wherein the mask is a sheet of paper.

9. The method according to claim 7, wherein the coating is deposited by spraying.

10. The method according to claim 7, wherein the coating is subjected to an oxidizing annealing so as to form the first anti-adherent layer oxidized on the inner surface of the bottom.

11. A system for solidification of crystalline material comprising:
a device forming crucible according to claim 1,
means for generating a thermal gradient inside the device forming crucible and
a counter-crucible made from a material presenting a lower thermal resistivity than a thermal resistivity of a material forming the bottom of the device forming crucible.

12. The system according to claim 11, wherein the counter-crucible is located against the outer surface of the bottom of the device forming crucible, the counter-crucible presenting a bottom with an inner surface having a complementary shape to an outer surface of the bottom of the device forming crucible.

13. The system according to claim 11, wherein the bottom of the counter-crucible has a constant thickness.

14. The system according to claim 11, wherein the outer surface of the bottom of the device forming crucible is flat.

15. The system according to claim 11, comprising a heat extractor facing the first portion and the second portion of the bottom of the device forming crucible.

16. The system according to claim 11, comprising an additional thermal resistance arranged between the counter-crucible and a recess formed on the outer surface of the bottom of the device forming crucible so as to perform thermal conduction of the recessed area with the counter-crucible.

17. A method for fabrication of a crystalline material by directional solidification of a material in liquid phase in a device forming crucible of a system according to claim 11, comprising:
providing the device forming crucible provided with a seed made from crystalline material made from a second crystalline material and arranged in such a way as to at least partially cover the second portion of the bottom of the device forming crucible, the device forming crucible being at least partially filled by a feedstock of material to be solidified,
generating a first thermal gradient in the device forming crucible so as to melt the material to be solidified, the seed remaining at least partially in solid state,
generating a second thermal gradient in the device forming crucible so as to solidify the material in the molten state from the seed.

18. The method according to claim 17, wherein the seed is arranged in an indentation of the bottom of the device forming crucible.

19. The device according to claim 2, wherein the first anti-adherent layer and the second anti-adherent layer are made from the same material.

20. The device according to claim 1, wherein an inner wall of the bottom of the tightly sealed part comprises an indentation representative of the second portion, the indentation is formed by a blind hole.

21. The device according to claim 1, wherein the bottom of the tightly sealed part is devoid of through hole.

* * * * *